United States Patent
Pawlenko et al.

(10) Patent No.: US 11,849,552 B2
(45) Date of Patent: Dec. 19, 2023

(54) ADJUSTABLE FREE-STANDING SUPPORT FOR A DATA DISPLAY MONITOR

(71) Applicant: Manufacturing Design Solutions, Holland, PA (US)

(72) Inventors: Nikolai F Pawlenko, Holland, PA (US); Ivan W. Pawlenko, Holland, PA (US); Ivan Pawlenko, Holland, PA (US); Sean J. Kennison, Washington, PA (US)

(73) Assignee: Manufacturing Design Solutions, Holland, PA (US)

( * ) Notice: Subject to any disclaimer, the term of this patent is extended or adjusted under 35 U.S.C. 154(b) by 139 days.

(21) Appl. No.: 17/314,020

(22) Filed: May 6, 2021

(65) Prior Publication Data
US 2022/0361352 A1  Nov. 10, 2022

(51) Int. Cl.
*H05K 5/02* (2006.01)
*G06F 1/18* (2006.01)
*H05K 5/00* (2006.01)

(52) U.S. Cl.
CPC ........... *H05K 5/0234* (2013.01); *G06F 1/181* (2013.01); *H05K 5/0017* (2013.01); *H05K 5/0226* (2013.01)

(58) Field of Classification Search
CPC .... G06F 1/1601; G06F 1/1654; G06F 1/1637; G06F 1/181; H05K 5/0234; H05K 5/0226
See application file for complete search history.

(56) References Cited

U.S. PATENT DOCUMENTS

| | | | |
|---|---|---|---|
| 4,483,503 A | 11/1984 | Gahan | |
| 4,768,744 A | 9/1988 | Leeds et al. | |
| 4,844,387 A | 7/1989 | Sorgi et al. | |
| 4,932,620 A | 6/1990 | Foy | |
| 6,061,104 A | 5/2000 | Evanicky et al. | |
| 6,507,352 B1* | 1/2003 | Cohen | G06F 1/181 |
| | | | 705/16 |
| 6,554,238 B1* | 4/2003 | Hibberd | A47B 81/061 |
| | | | 248/278.1 |

(Continued)

FOREIGN PATENT DOCUMENTS

| | | |
|---|---|---|
| CN | 104747874 | 7/2015 |
| GB | 2294874 | 5/1995 |
| GB | 2294874 | 5/1996 |

*Primary Examiner* — Rockshana D Chowdhury
*Assistant Examiner* — Douglas R Burtner
(74) *Attorney, Agent, or Firm* — LaMorte & Associates P.C.

(57) ABSTRACT

A support assembly for a data display monitor. The support assembly utilizes a base frame that can be placed on a flat working surface. A hub is connected to the base frame and is free to rotate about a vertical axis. At least one support arm is provided. Each support arm is connected to the hub with a first hinge connection. Each support arm also connects to a mounting plate with a second hinge connection. The second hinge connection enables the mounting plate to rotate at least ninety degrees through a range of motion. The mounting plate is attached to the data display monitor. As the mounting plate moves through its range of motion, the data display monitor moves with the mounting plate. The data display monitor can therefore be moved through the range of motion between a vertical orientation and a horizontal orientation.

11 Claims, 5 Drawing Sheets

(56) References Cited

U.S. PATENT DOCUMENTS

| | | |
|---|---|---|
| 7,028,961 B1 | 4/2006 | Dittmer et al. |
| 7,091,961 B2 | 8/2006 | Ditzik |
| D568,325 S | 5/2008 | Muday et al. |
| 7,589,959 B2* | 9/2009 | Ikeda .................. G06F 1/1601 |
| | | 361/679.21 |
| 8,295,652 B1* | 10/2012 | Newstead ............ G06F 1/1637 |
| | | 382/311 |
| 8,490,934 B2 | 7/2013 | Dittmer |
| 9,092,200 B2* | 7/2015 | Richard ............... H05K 5/0221 |
| 9,210,999 B2* | 12/2015 | Martin ................. A47B 13/081 |
| 9,357,846 B2* | 6/2016 | Hung .................... F16M 11/38 |
| 9,557,002 B2* | 1/2017 | Wong ................. F16M 11/2064 |
| 9,723,919 B1* | 8/2017 | Randolph ............. A47B 21/02 |
| 10,317,006 B2 | 6/2019 | Kozlowski, Jr. et al. |
| 10,606,319 B1* | 3/2020 | Brocklesby .......... G06F 1/1681 |
| 10,610,010 B2 | 4/2020 | Matlin et al. |
| 10,620,662 B2* | 4/2020 | Tseng .................... F16M 11/10 |
| 10,754,391 B2* | 8/2020 | Park ......................... E05D 5/10 |
| 10,806,043 B2* | 10/2020 | Lee ...................... F16M 13/04 |
| 10,876,680 B2 | 12/2020 | Harripersaud |
| 11,106,117 B2* | 8/2021 | Hong ................. H04N 1/00562 |
| 11,112,057 B2* | 9/2021 | Janechek ........... F16M 11/2042 |
| 11,144,271 B1* | 10/2021 | Joyce .................... G06F 3/1446 |
| 11,293,584 B2* | 4/2022 | Kleist ................. F16M 13/022 |
| 11,419,409 B2* | 8/2022 | Koenig ..................... A47B 5/06 |
| 11,486,537 B2* | 11/2022 | Glickstein ............. F16M 13/02 |
| 2002/0145846 A1* | 10/2002 | Helot ................... G06F 1/1616 |
| | | 361/679.08 |
| 2005/0104863 A1* | 5/2005 | Kroll ..................... G06F 3/0488 |
| | | 345/173 |
| 2006/0176655 A1* | 8/2006 | Hillman ............. F16M 11/2014 |
| | | 361/679.21 |
| 2007/0058329 A1* | 3/2007 | Ledbetter ............. G06F 1/1616 |
| | | 361/679.06 |
| 2008/0048984 A1* | 2/2008 | Ikeda .................... G06F 1/1601 |
| | | 345/168 |
| 2008/0251659 A1* | 10/2008 | Matias ................. A47B 23/044 |
| | | 248/166 |
| 2009/0100638 A1* | 4/2009 | Lin ....................... G06F 1/1601 |
| | | 16/221 |
| 2009/0308991 A1 | 12/2009 | Stengel |
| 2010/0321877 A1* | 12/2010 | Moser ................... G06F 1/1654 |
| | | 361/679.29 |
| 2011/0019344 A1* | 1/2011 | Russell ............. F16M 11/2085 |
| | | 361/679.01 |
| 2011/0043990 A1* | 2/2011 | Mickey ................. G06F 1/1601 |
| | | 361/679.04 |
| 2011/0079685 A1 | 4/2011 | Kwak |
| 2013/0176672 A1* | 7/2013 | Richard ............... H05K 5/0226 |
| | | 361/679.01 |
| 2013/0219660 A1* | 8/2013 | Hsu ....................... G06F 1/1681 |
| | | 16/364 |
| 2013/0314300 A1* | 11/2013 | Moscovitch .......... G06F 3/1431 |
| | | 345/1.3 |
| 2014/0015448 A1* | 1/2014 | Wikander ............. G06F 1/1601 |
| | | 318/3 |
| 2014/0063771 A1* | 3/2014 | Bando .................... F16M 11/10 |
| | | 248/49 |
| 2014/0340827 A1* | 11/2014 | Truong ....................... G06F 1/16 |
| | | 248/122.1 |
| 2014/0375194 A1* | 12/2014 | Arima ................... G06F 1/1616 |
| | | 312/322 |
| 2015/0002998 A1* | 1/2015 | Arima ................... G06F 1/1681 |
| | | 345/173 |
| 2015/0036290 A1* | 2/2015 | Yukawa ................ G06F 1/1637 |
| | | 361/679.58 |
| 2015/0286244 A1* | 10/2015 | Richard ............... H05K 5/0234 |
| | | 361/679.22 |
| 2015/0289652 A1* | 10/2015 | Strahinic ................. A47B 97/00 |
| | | 211/85.8 |
| 2016/0051067 A1* | 2/2016 | Law .................... F16M 11/2021 |
| | | 361/679.22 |
| 2016/0161045 A1* | 6/2016 | Lee ....................... F16M 11/38 |
| | | 248/157 |
| 2016/0291650 A1* | 10/2016 | Lee ....................... G06F 1/1626 |
| 2017/0132960 A1* | 5/2017 | Kis-Benedek Pinero ................. |
| | | G06F 1/1637 |
| 2017/0311464 A1* | 10/2017 | Park ...................... F16M 11/10 |
| 2017/0311737 A1* | 11/2017 | Law .................... F16M 11/2014 |
| 2019/0138054 A1* | 5/2019 | Alva .................... G06F 1/1624 |
| 2019/0196534 A1* | 6/2019 | Tseng .................... F16M 11/10 |
| 2020/0097043 A1* | 3/2020 | Kim ....................... F16M 11/24 |
| 2020/0249726 A1* | 8/2020 | Brocklesby ........... H02G 11/003 |
| 2020/0264672 A1* | 8/2020 | Morino ................. G06F 1/1637 |
| 2020/0324915 A1* | 10/2020 | Wright ..................... B66F 9/063 |
| 2021/0181803 A1* | 6/2021 | Gupta .................... G06F 1/1616 |
| 2021/0289645 A1* | 9/2021 | Wang .................... G06F 1/1637 |
| 2022/0092921 A1* | 3/2022 | Barbour ................ F16M 11/18 |
| 2022/0120374 A1* | 4/2022 | Pavlov .................. F16M 11/08 |

* cited by examiner

ADJUSTABLE FREE-STANDING SUPPORT FOR A DATA DISPLAY MONITOR

BACKGROUND OF THE INVENTION

1. Field of the Invention

In general, the present invention relates to stands and supports for heavy electronic monitors. More particularly, the present invention relates to stands and supports for the data display monitors utilized by air traffic controllers.

2. Prior Art Description

Most all major airports have air traffic controllers. The job of the air traffic controller is to control the flow of air traffic to, from, and about the airport. In this manner, aircraft can load, take off, land, and unload in a logistically efficient manner. Furthermore, it is the job of the air traffic controller to oversee air traffic in the air and on the ground to ensure that no two aircraft are ever near being at the same place at the same time. Some of the most important tools used by air traffic controllers include the airport radar system, the aircraft transponder systems, and ground sensors on the tarmac of the airport. The radar systems detect the position of aircraft in the air surrounding the airport. The transponder systems identify the aircraft. Lastly, the ground sensor systems identify the location of aircraft on the ground. The radar systems, transponder systems, and ground sensor systems all produce data. The air traffic controllers use software that converts this data to images that are displayed on a data display monitor.

The data display monitor utilized by air traffic control in the United States is regulated. Furthermore, the same display monitor type is used in most major airports and in training facilities to ensure that there is consistency between airport facilities and training for the air traffic controller staff. The current data display monitor is both large and heavy. The weight of the current data display monitor is near twenty kilograms. Furthermore, in use, the data display monitor is constantly being touched and pressed by the air traffic controllers. Accordingly, the data display monitor must be robustly mounted in order to support the weight of the data display monitor and the forces applied to the data display monitor. However, the data display monitor must also be adjustable in position and orientation to meet application requirements and the ergonomic preferences of the air traffic controllers using the data display monitors.

It will be understood that in different airports, the surfaces from which air traffic controllers work vary greatly. As a consequence, the area upon which a data display monitor must be positioned also varies from airport to airport and between workstations within the same airport. Accordingly, it is a government requirement that all supports for data display monitors be free standing. That is, the support for the data display monitor must not require any physically connection with the work surface upon which it is placed. In this manner, the data display monitor support can be placed on any flat working surface, regardless of the composition of the working surface. Free standing supports that are capable of supporting heavy data display monitors tend to be both bulky and heavy. The result is that there is no room left on the working surface for other equipment, such as keyboards and/or communication controls.

In the prior art, there are many mounts and support systems for display monitors. Most are for traditional computer monitors or for televisions. Many prior art support systems allow for some adjustment in the position of a display monitor. However, the display monitor is almost always maintained in a generally vertical orientation, plus or minus some small adjustable inclination angle. Such prior art supports do not enable the display monitor to be adjusted from a traditional vertical orientation to a fully horizontal orientation. For example, in U.S. Pat. No. 10,610,010 to Matlin, a workstation support is shown that can be adjusted in height. However, the support must be mounted to a work surface and is not free standing. Furthermore, the inclination of the workstation is very limited in its adjustability and is incapable of adjusting between vertical and horizontal orientations.

A need therefore exists for a support system for a data display monitor that allows for height adjustments, rotational adjustments, and inclination adjustments between the vertical and horizontal. A need also exists for such a support that is free standing and capable of holding data display monitors of significant size and weight. These needs are met by the present invention as described and claimed below.

SUMMARY OF THE INVENTION

The present invention is a support assembly for a data display monitor. The data display monitor has a face surface and a back surface. When viewing the data display monitor, a person views the face surface of the data display monitor.

The support assembly utilizes a base frame that can be placed on a tabletop or other working surface. A hub is supported by the base frame. The hub is connected to the base frame and is free to rotate about a vertical axis independent of the base frame while remaining attached to the base frame.

At least one support arm is provided. Each support arm has a first end and an opposite second end. The second end of each support arm is connected to the hub with a first hinge connection. The first end of each support arm connects to a mounting plate with a second hinge connection. The second hinge connection enables the mounting plate to rotate at least ninety degrees through a range of motion. The mounting plate is mechanically attached to the back surface of the data display monitor. As the mounting plate moves through its range of motion, the data display monitor moves with the mounting plate. The face surface of the data display monitor can therefore be selectively moved through the range of motion between a vertical orientation and a horizontal orientation.

BRIEF DESCRIPTION OF THE DRAWINGS

For a better understanding of the present invention, reference is made to the following description of an exemplary embodiment thereof, considered in conjunction with the accompanying drawings, in which.

DETAILED DESCRIPTION OF THE DRAWINGS

Although the present invention support assembly can be embodied in many ways, only one exemplary embodiment is illustrated. The exemplary embodiment is being shown for the purposes of explanation and description. The exemplary embodiment is selected in order to set forth one of the best modes contemplated for the invention. The illustrated embodiment, however, is merely exemplary and should not be considered as a limitation when interpreting the scope of the claims.

Figure 1:
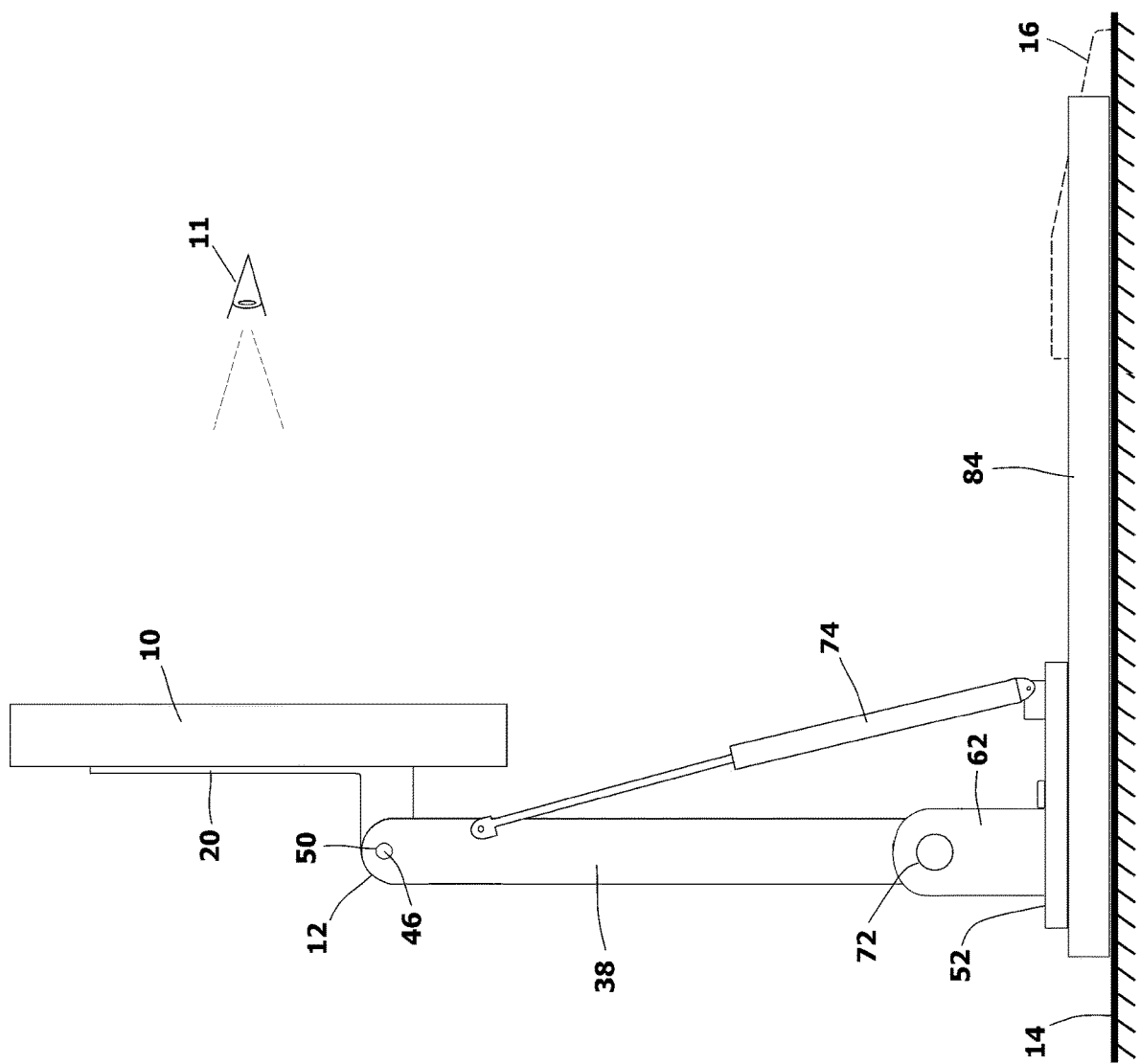
FIG. 1 shows an exemplary embodiment of the present invention support system holding a data display monitor in a near vertical orientation.
Figure 2:
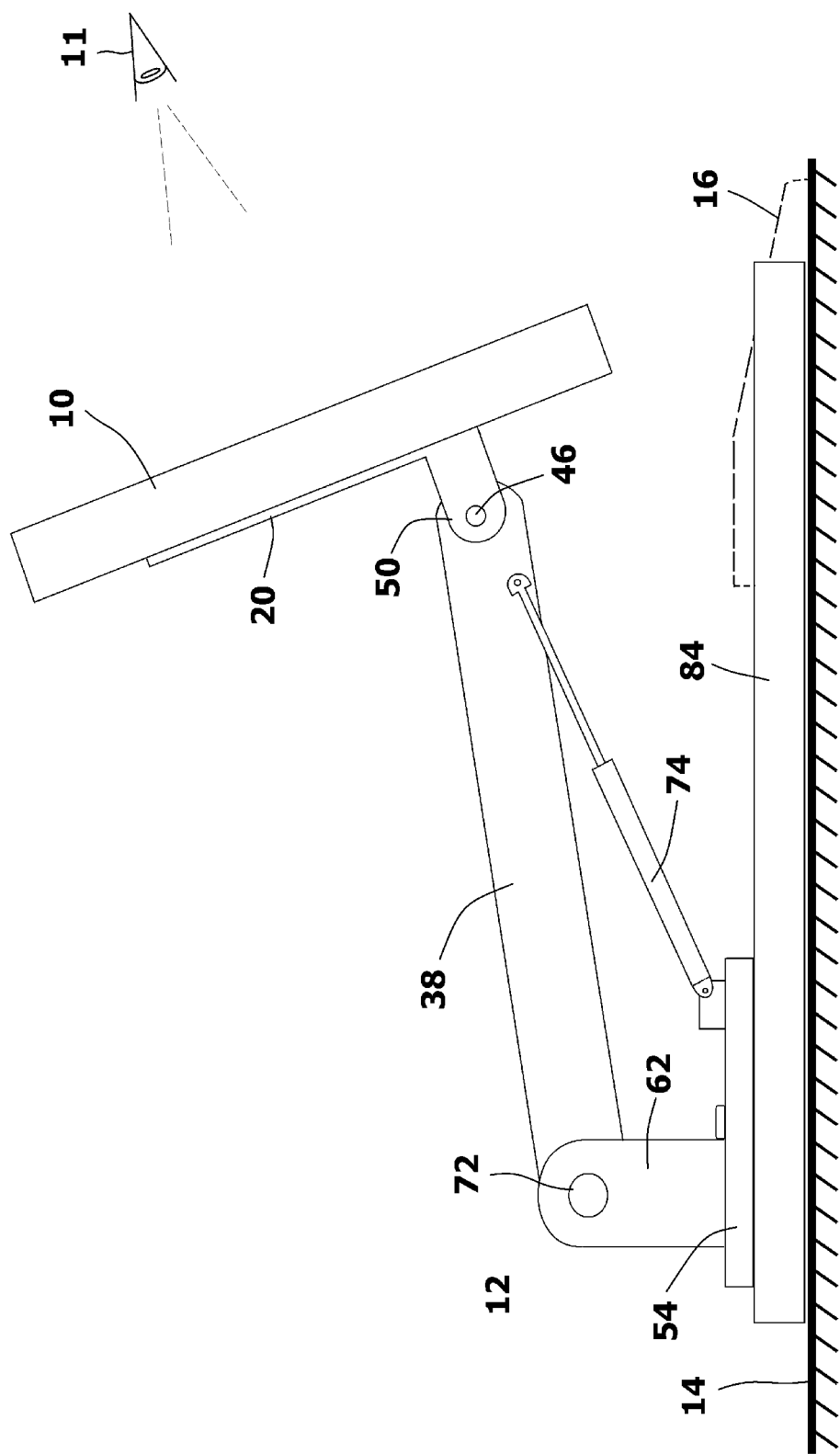
FIG. 2 shows the exemplary embodiment of FIG. 1 holding a data display monitor in an inclined orientation.
Figure 3:
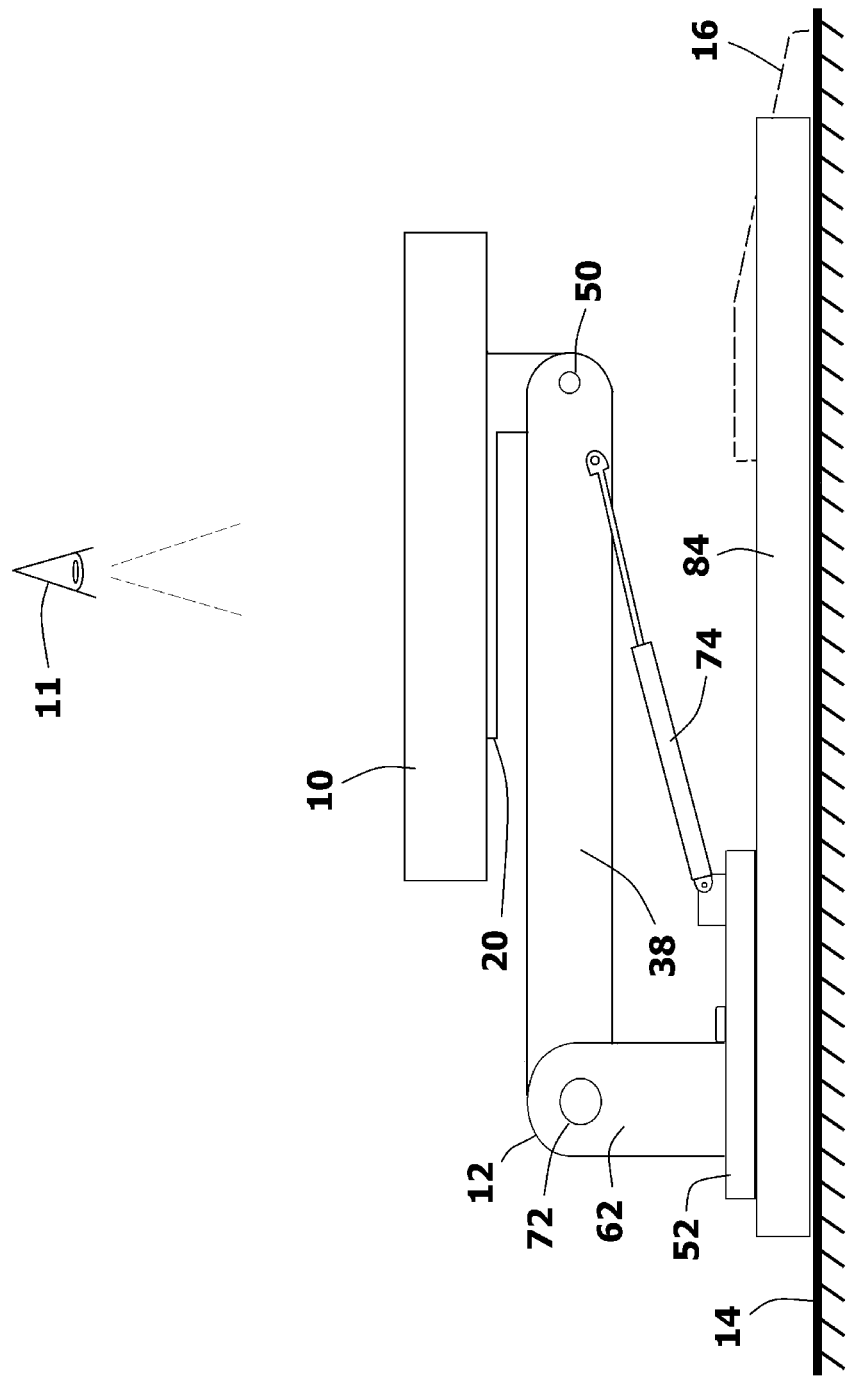
FIG. 3 shows the exemplary embodiment of FIG. 1 holding a data display monitor in a near horizontal orientation.

Referring to FIG. 1, FIG. 2 and FIG. 3, it can be seen that when an air traffic controller 11 is at work, the air traffic controller 11 faces his/her data display monitor 10. The data display monitor 10 has a face surface 13 and a rear surface 15. The rear surface 15 mounts to a support. The face surface 13 is viewed by the air traffic controller 11. Depending upon the location of the data display monitor 10 and/or the preferences of the air traffic controller 11, the data display monitor 10 may be in a near vertical orientation, such as in FIG. 1, an inclined orientation, such as in FIG. 2 or a near horizontal orientation, such as in FIG. 3. Furthermore, the data display monitor 10 is adjustable throughout the full range of motion represented by the three illustrated orientations. The data display monitor 10 is manufactured according to government specifications and is both large and heavy. The data display monitor 10 is affixed to a support assembly 12. By governmental contract requirements, the support assembly 12 is required to be free standing. That is, the support assembly 12 must rest on a working surface 14 and is in no manner be affixed to the underlying working surface 14. Furthermore, the support assembly 12 leaves room on the working surface 14 for other equipment, such as a keyboard 16.

Figure 4:
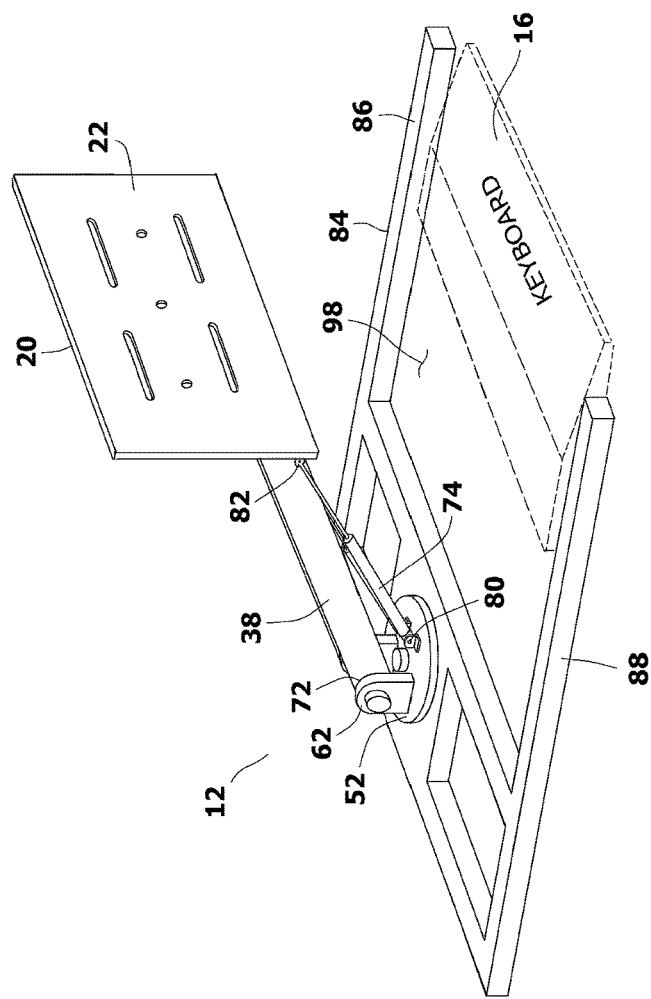
FIG. 4 shows the exemplary embodiment of FIG. 1 without the data display monitor.
Figure 5:
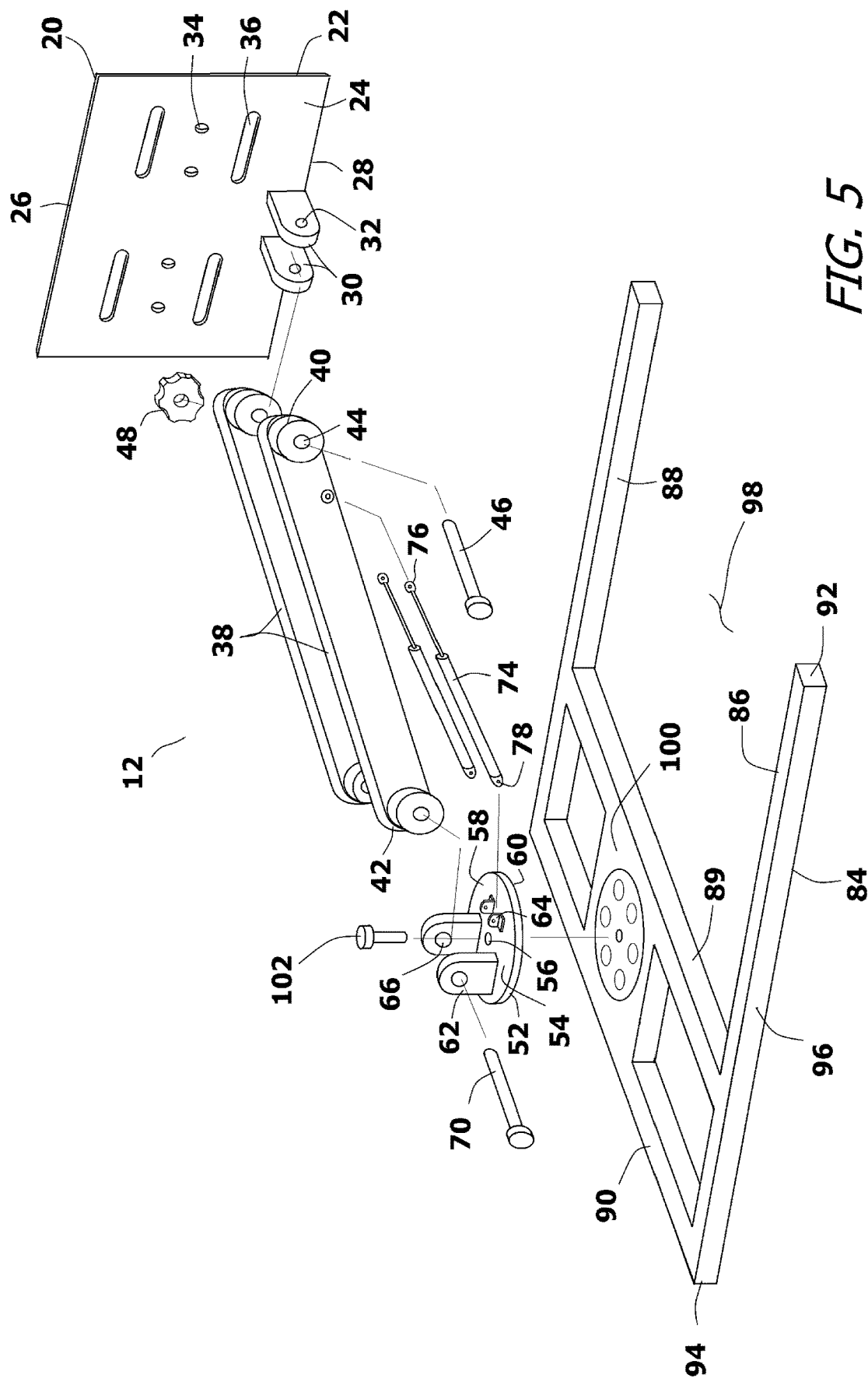
FIG. 5 shows an exploded view of the embodiment of FIG. 4.

Referring to FIG. 4 and FIG. 5 in conjunction with FIGS. 1, 2 and 3, it can be seen that the support assembly 12 has a mounting plate 20. The mounting plate 20 has a front surface 22 and a rear surface 24. The front surface 22 and the rear surface 24 extend between a top edge 26 and a bottom edge 28. Two hinge blocks 30 extend from the rear surface 24 of the mounting plate 20 at a tangent to the bottom edge 28. This location at the very bottom of the rear surface 24, enables the hinge blocks 30 to support the full intended range of motion. The hinge blocks 30 define bolt holes 32 that are concentrically aligned.

Mounting holes 34 and/or mounting slots 36 are formed in the mounting plate 20. The mounting holes 34 and/or mounting slots 36 enable the mounting plate 20 to be mechanically connected to the rear surface 15 of the data display monitor 10 using mechanical connectors 37 such as bolts or screws.

Two parallel support arms 38 engage the hinge blocks 30 on the rear surface 24 of the mounting plate 20. The support arms 38 have a first end 40 and an opposite second end 42. Between the ends 40, 42, the support arms 38 can vary in length between 0.3 meters and 0.5 meters depending upon the needs of a particular installation. Holes 44 are formed in the first ends 40 of the support arms 38 that align with the bolt holes 32 in the hinge blocks 30. A bolt 46 extends through the bolt holes 32 in the hinge blocks 30 and the holes 44 in the first ends 40 of the support arms 38. The bolt 46 can engage a nut, but preferably engages an adjustment knob 48, therein forming a friction hinge 50. When the adjustment knob 48 is loosened, the support arms 38 can be adjusted relative to the mounting plate 20. Conversely, when the adjustment knob 48 is tightened, the orientation between the support arms 38 and the mounting plate 20 becomes fixed. The hinge blocks 30 and/or the support arms 38 can be crenulated to ensure no slippage between parts when the adjustment knob 48 is tightened. Alternatively, friction washers can be interposed between the hinge blocks 30 and the support arms 38 to prevent slippage when the adjustment knob 48 is tightened.

The support arms 38 attach to a rotatable hub 52. The rotatable hub 52 has a circular base plate 54. The circular base plate 54 has a hole 56 in its center point around which the circular base plate 54 can rotate. Thus, the base plate 54 can rotate about a vertical axis. The circular base plate 54 also has a top surface 58 and an opposite bottom surface 60. Hinge blocks 62 and strut brackets 64 extend upwardly from the top surface 58 of the circular base plate 54 at eccentric positions. Concentric bolt holes 66 are formed through the hinge blocks 62. Likewise, holes 68 are formed in the second ends 42 of the support arms 38 that align with the bolt holes 66 in the hinge blocks 62. A bolt 70 extends through the holes 66 in the hinge blocks 62 and the holes 68 in the second ends 42 of the support arms 38, therein forming a hinge joint 72. Optionally, a locking knob can be provided that engages the bolt 70. The locking knob can be used to lock the hinge joint 72 into a selected orientation.

Two counterweight struts 74 are provided. The struts 74 can be gas struts or spring struts and are engineered to counteract the weight of the mounting plate 20 and the data display monitor 10 at the first end 40 of the support arms 38. Each strut 74 has a first end 76 that is anchored to one of the support arms 38 near the friction hinge 50. Each strut 74 also has a second end 78 that connects to one of the strut brackets 64 on the rotatable hub 52. Both ends 76, 78 of the struts 74 are engaged with hinged connections 80, 82 that enable the angle of the struts 74 to change as the orientation of the support arms 38 change. The struts 74 counterbalance the weight of the data display monitor 10 and the mounting plate 20. As a consequence, the data display monitor 10 can be selectively raised and lowered by simple manual manipulation. The raising and lowering of the data display monitor 10 changes the angle of inclination embodied by the support arms 38. The struts 74 counterbalance the weight of the data display monitor 10 regardless of their angle of inclination. As a result, the support arms 38 will remain in any angle of inclination into which they are manually adjusted. The weight of the data display monitor 10 does not alter the position of the support arms 38 since this weight is counterbalanced by the struts 74.

A rigid base frame 84 is provided. The base frame 84 has two parallel side rails 86, 88 that are joined together by two parallel crossbars 89, 90. The side rails 86, 88 are longer than the support arms 38. In this manner, the center of mass for the data display monitor 10 will always be above the base frame 84 and will remain stable. The side rails 86, 88 have a first end 92, a second end 94 and a midpoint 96 between the first end 92 and the second end 94. The crossbars 89, 90 are positioned toward the second ends 94 of the side rails 86, 88, wherein the crossbars 89, 90 intersect the side rails 86, 88 between the second end 94 and the midpoints 96 of the side rails 86, 88. The crossbars 89, 90 are preferably longer than the data display monitor 10 is wide. This configuration leaves a large gap space 98 in between the side rails 86, 88. The gap space 98 extends from the first ends 92 of the side rails 86, 88 to at least the midpoints 96 of the side rails 86, 88.

The gap space 98 between the side rails 86, 88 serves important functions. Since the gap space 98 is wider than the data display monitor 10, the data display monitor 10 can be lowered without contacting the side rails 86, 88. This eliminates possible pinch points that could cause injury as the data display monitor 10 is being positionally adjusted. Additionally, the gap space 98 leaves room on the working surface 14 for secondary equipment, such as a keyboard 16. In this manner, available working surface space is shared and an ergonomic workstation can be created.

A platform 100 extends between the crossbars 89, 90 in the middle of the crossbars 89, 90. The rotatable hub 52 rests upon the platform 100. A pivot bolt 102 extends through the hole 56 at the center of the circular base plate 54 and through the platform 100. The pivot bolt 102 mechanically connects the circular base plate 54 to the platform 100, while leaving the circular base plate 54 free to rotate relative to the platform 100. The ability of the circular base plate 54 to rotate can be enhanced by placing ball bearings, Teflon® pads or other friction reducing constructs, between the platform 100 and the rotatable hub 52.

Referring to all figures, it will be understood that in use, the support assembly 12 is placed atop the working surface 14. The working surface 14 can be any flat surface with an area large enough to accommodate the base frame 84. The data display monitor 10 is affixed to the mounting plate 20. The height of the data display monitor 10 can be adjusted by manually pushing the data display monitor 10 up or down. The weight of the data display monitor 10 is vertically counterbalanced by the struts 74. As such, upward and downward adjustments generally require the same degree of manual manipulation.

The data display monitor 10 can be rotated about a vertical axis by simply rotating the hub 52. As the hub 52 rotates, the support arms 38, struts 74 and mounting plate 20 rotate in unison with the data display monitor 10. To change the angle of inclination of the data display monitor 10, the mounting plate 20 is rotated about the friction hinge 50. The friction hinge 50 can be loosened and tightened by turning the adjustment knob 48. This enables the data display monitor 10 to adjust from the vertical orientation of FIG. 1 to the horizontal orientation of FIG. 2 and any angle of inclination therebetween. By positioning the friction hinge 50 at the bottom of the mounting plate 20, the center of gravity for the data display monitor 10 remains above the base frame 84 throughout all the adjustable positions.

It will be understood that the embodiment of the present invention that is illustrated and described is merely exemplary and that a person skilled in the art can make many variations to that embodiment. For instance, the dimensions and weight of the data display monitor can vary, provided the struts are adjusted to provide the appropriate counterweight. All such embodiments are intended to be included within the scope of the present invention as defined by the claims.

What is claimed is:

1. An assembly, comprising:
   a data display monitor having a face surface and a rear surface;
   a base frame having two side rails and a platform disposed between said two side rails;
   a hub having a base plate, wherein said base plate has a top surface, a center, and is connected to said platform by a pivot bolt that extends through said top surface of said base plate at said center, and wherein said base plate is free to rotate about said pivot bolt independent of said base frame;
   at least one hinge block that extends from said top surface of said base plate at a position eccentric from said pivot bolt;
   at least one support arm having a first end and an opposite second end, wherein said second end is connected to said at least one hinge block with a first hinge connection;
   a mounting plate connected to said first end of said at least one support arm with a second hinge connection, wherein said second hinge connection enables said mounting plate to rotate at least ninety degrees through a range of motion, wherein said mounting plate is mechanically attached to said rear surface of said data display monitor, and said face surface of said data display device moves with said mounting plate through said range of motion between a vertical orientation and a horizontal orientation.

2. The assembly according to claim 1, further including at least one strut bracket that extends upwardly from the top surface of said base plate, and at least one strut that extends from said at least one strut bracket to said at least one support arm for providing a counterbalance to said data display monitor.

3. The assembly according to claim 1, wherein said mounting plate has a rear surface and a bottom edge and said second hinge connection includes connection blocks that extend from said rear surface of said mounting plate proximate said bottom edge.

4. The assembly according to claim 3, wherein a bolt interconnects said connection blocks with said first end of said at least one support arm, therein forming said second hinge connection.

5. The assembly according to claim 4, wherein said bolt engages an adjustment knob that can tighten on said bolt and lock said second hinge connection in a fixed configuration.

6. The assembly according to claim 1, wherein said second hinge connection is a friction hinge.

7. The assembly according to claim 1, wherein said two side rails are parallel, and coplanar, wherein said side rails have first ends, second ends and midpoints.

8. The assembly according to claim 7, wherein said base frame includes crossbars that extend between said side rails and separate said side rails by a first distance.

9. The assembly according to claim 8, wherein said data display monitor has a length and said first distance between said side rails is greater than said length.

10. The assembly according to claim 8, wherein said crossbars intersect said side rails between said midpoints of said side rails and said second ends of said side rails, therein leaving an open gap space between said side rails from said first ends of said side rails to said crossbars.

11. The assembly according to claim 8, wherein said platform that extends between said crossbars.

* * * * *